United States Patent
Higashitani

(10) Patent No.: US 8,432,733 B2
(45) Date of Patent: *Apr. 30, 2013

(54) DATA RETENTION OF LAST WORD LINE OF NON-VOLATILE MEMORY ARRAYS

(75) Inventor: Masaaki Higashitani, Cupertino, CA (US)

(73) Assignee: SanDisk Technologies Inc., Plano, TX (US)

(*) Notice: Subject to any disclaimer, the term of this patent is extended or adjusted under 35 U.S.C. 154(b) by 16 days.

This patent is subject to a terminal disclaimer.

(21) Appl. No.: 13/084,333

(22) Filed: Apr. 11, 2011

(65) Prior Publication Data

US 2011/0188313 A1 Aug. 4, 2011

Related U.S. Application Data

(63) Continuation of application No. 12/237,321, filed on Sep. 24, 2008, now Pat. No. 7,983,078.

(51) Int. Cl.
*G11C 16/06* (2006.01)
*G11C 16/10* (2006.01)
*G11C 16/12* (2006.01)
*G11C 16/14* (2006.01)
*G11C 16/34* (2006.01)

(52) U.S. Cl.
USPC ............ 365/185.02; 365/185.22; 365/185.18; 365/185.29; 365/185.28; 365/185.17; 365/185.24

(58) Field of Classification Search ............ 365/185.22, 365/185.02, 185.18, 185.29, 185.24, 185.28, 365/185.17, 185.2
See application file for complete search history.

(56) References Cited

U.S. PATENT DOCUMENTS

| 6,987,696 | B1 | 1/2006 | Wang et al. |
| 7,079,437 | B2 | 7/2006 | Hazama et al. |
| 7,259,999 | B2 | 8/2007 | Syzdek et al. |
| 7,272,049 | B2 | 9/2007 | Kang et al. |
| 7,480,178 | B2 | 1/2009 | Park et al. |

(Continued)

FOREIGN PATENT DOCUMENTS

JP 2008084471 A 4/2008

OTHER PUBLICATIONS

International Search Report and Written Opinion of the International Searching Authority dated Nov. 23, 2009, International Application No. PCT/US2009/057639.

(Continued)

*Primary Examiner* — J. H. Hur
(74) *Attorney, Agent, or Firm* — Vierra Magen Marcus LLP

(57) ABSTRACT

Techniques for operating non-volatile storage compensate for differences in floating gate coupling effect experienced by non-volatile storage elements on different word lines. An erase of a group of non-volatile storage elements is performed. A set of the non-volatile storage elements are for storing data and at least one of the non-volatile storage elements is a dummy that is not for storing data. The dummy is a neighbor to one of the data non-volatile storage elements. The data non-volatile storage elements are programmed at some point after the erase. Then, a programming voltage is applied to the dummy non-volatile storage element to increase the threshold voltage of the dummy to cause floating gate coupling effect to the neighbor non-volatile storage element to compensate for lesser floating gate coupling effect that the neighbor experienced during programming.

20 Claims, 13 Drawing Sheets

U.S. PATENT DOCUMENTS

| | | |
|---|---|---|
| 7,535,764 B2 * | 5/2009 | Chin et al. ................. 365/185.2 |
| 7,869,280 B2 | 1/2011 | Kosaki et al. |
| 7,881,114 B2 | 2/2011 | Park et al. |
| 7,983,078 B2 * | 7/2011 | Higashitani .............. 365/185.02 |
| 2006/0139997 A1 | 6/2006 | Park et al. |
| 2006/0239077 A1 | 10/2006 | Park et al. |
| 2008/0007999 A1 | 1/2008 | Park et al. |
| 2008/0130363 A1 | 6/2008 | Hosono |
| 2008/0137422 A1 | 6/2008 | Hosono |
| 2008/0239822 A1 | 10/2008 | Kosaki et al. |
| 2008/0273388 A1 * | 11/2008 | Chin et al. ............... 365/185.17 |
| 2010/0074016 A1 | 3/2010 | Higashitani |

OTHER PUBLICATIONS

English Abstract of Foreign Patent Document JP2008084471, Published Apr. 10, 2008, Applicant Toshiba Corp.

Notice of Allowance and Fee(s) Due dated Mar. 21, 2011, U.S. Appl. No. 12/237,321, filed Sep. 24, 2008.

Response to European Office Action dated Nov. 15, 2011, European Patent Application No. 09792761.0 filed Sep. 21, 2009, 15 pages.

Chinese Office Action dated Jan. 28, 2013, Chinese Patent Application No. 200980136368.8, filed Sep. 27, 2009, 20 pages.

* cited by examiner (Conventional Art)

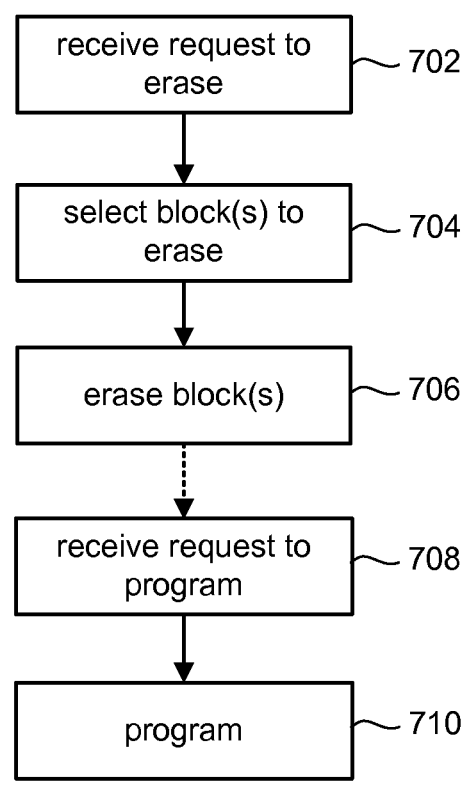

DATA RETENTION OF LAST WORD LINE OF NON-VOLATILE MEMORY ARRAYS

CLAIM OF PRIORITY

This application is a continuation application of U.S. patent application Ser. No. 12/237,321, entitled "DATA RETENTION OF LAST WORD LINE OF NON-VOLATILE MEMORY ARRAYS," filed Sep. 24, 2008, now U.S. Pat. No. 7,983,078, which is incorporated herein by reference in its entirety.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROMs or flash memory devices have a configuration referred to as a NAND configuration in which memory cells are grouped as NAND strings with each NAND string associated with a bit line. When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing with each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

Shifts in the apparent charge stored on a floating gate can occur because of the coupling of an electric field based on the charge stored in adjacent floating gates. This phenomenon is described in U.S. Pat. No. 5,867,429, which is incorporated herein by reference in its entirety. The problem occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored. Note that the floating gate coupling problems can be due to coupling between adjacent floating gates (floating gate-to-floating gate coupling) and from a channel of one memory cell to the floating gate of an adjacent memory cell (channel-to-floating gate).

The effect of the floating gate coupling is of greater concern for multi-state devices because multi-state devices typically have smaller threshold voltage margins between states than that of binary devices, in addition to storing greater amounts of charge. Additionally, the difference in charge stored between the lowest state and the highest state of a multi-state device is likely to be greater than the difference in charge stored between the erased and programmed states of a binary memory device. The magnitude of the voltage coupled between adjacent floating gates is based on the magnitude of charge stored on the adjacent floating gates.

In some implementations, each NAND string is connected to a number of data word lines and one or more dummy word lines. Each memory cell on a NAND string is connected to one of the word lines. A given word line is connected to numerous NAND strings. For example, a NAND string may have 64 memory cells that store user data (each of which is connected to a separate word line) and one or more dummy memory cells that do not store user data (connected to dummy word lines). Dummy memory cells that are connected to the dummy word lines are not used for data storage. In a memory array that uses dummy word lines, some of the data memory cells have another data memory cell on each side. However, a memory cell at the end of the NAND string has a data memory cell on one side and a dummy memory cell on the other side. This can lead to differences in the amount of floating gate coupling that is experienced by memory cells on the last word line.

SUMMARY OF THE INVENTION

Techniques are disclosed herein for operating non-volatile storage devices, including a technique that counters the effects of floating gate coupling. More particularly, the techniques compensate for differences in floating gate coupling effect experienced by memory cells on different word lines. In one implementation, techniques are used to compensate for differences experienced by memory cells on a last word line next to a drain side dummy word line on a NAND string.

In one implementation, one or more program voltages are applied to a dummy non-volatile storage element after programming nearby data non-volatile storage elements as follows. First, non-volatile storage elements are erased. A set of the non-volatile storage elements includes data non-volatile storage elements and at least one dummy non-volatile storage element that is not used for storing data. The dummy is a neighbor to one of the data non-volatile storage elements. The data non-volatile storage elements are programmed at some point after the erase. The programming causes at least some of the data non-volatile storage elements to experience an apparent increase in threshold voltage due to floating gate coupling that occurs due to subsequent programming of another one of the data non-volatile storage elements Then, a programming voltage is applied to the dummy non-volatile storage element. The programming voltage increases the threshold voltage of the dummy non-volatile storage element to a target level that compensates for lesser floating gate coupling experienced by the neighbor non-volatile storage element during programming of the other data non-volatile storage elements.

In one implementation, programming the data storage elements includes applying one or more programming voltages to each storage element and verifying whether each individual storage element has been programmed to a target level for that storage element. However, after applying the programming voltage to the dummy, no verification is made as to whether the dummy has been programmed to a target level that compensates for lesser floating gate coupling experienced by the neighbor non-volatile storage element during programming of the other data non-volatile storage elements.

In one implementation, after applying a program voltage to the dummy, verification of whether the dummy's threshold voltage reached the target level is performed. One or more additional programming voltages are applied to the dummy until the dummy reaches the target level.

In one embodiment, the programming voltage that is applied to the dummy is a "soft programming" voltage. Soft programming is a technique that is used to compress an erase threshold distribution by nudging the threshold voltages of non-volatile storage elements up slightly. To do so, the programming voltage is significantly lower than would be used to move the threshold voltage from, for example, an erased state to a programmed state. After applying the soft program voltage, a determination is made as to whether the threshold voltage of the dummy has reached a target level. The target level in this case may be below zero volts.

In one embodiment, the group of non-volatile storage elements are soft programmed after performing the erase and prior to programming the non-volatile storage elements. The soft programming includes applying a first program voltage to the data non-volatile storage elements while applying a second program voltage to the dummy non-volatile storage element. The second program voltage is less than the first program voltage. The result is that the dummy non-volatile storage element stays more deeply erased than the data non-volatile storage elements. Later the dummy non-volatile storage element is programmed to a higher threshold level from the more deeply erased state. This allows the dummy to cause a greater floating gate coupling effect than if the dummy were not so deeply erased.

One example implementation includes a group of non-volatile storage elements and one or more managing circuits in communication with the group of non-volatile storage elements. The group of non-volatile storage elements includes one or more sets (e.g., NAND strings) that include data non-volatile storage elements and at least one dummy non-volatile storage element. The dummy is a neighbor to one of the data non-volatile storage elements. The managing circuit erases the group of non-volatile storage elements. The managing circuit programs the data non-volatile storage elements at some point after the erase. The programming causes at least some of the data non-volatile storage elements to experience an apparent increase in threshold voltage due to floating gate coupling that occurs due to subsequent programming of another one of the data non-volatile storage elements.

Then, the managing circuit applies a programming voltage to the dummy non-volatile storage element. The programming voltage increases the threshold voltage of the dummy non-volatile storage element to a target level that compensates for lesser floating gate coupling experienced by the neighbor non-volatile storage element during programming of the other data non-volatile storage elements.

BRIEF DESCRIPTION OF THE DRAWINGS

FIG. 7 is a flow chart describing one embodiment of a process for erasing and programming memory cells.

DETAILED DESCRIPTION

Figure 1:
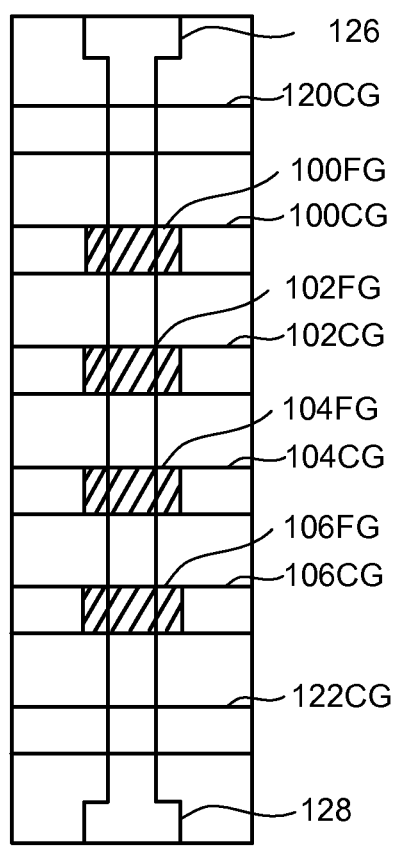
FIG. 1 is a top view of a NAND string.
Figure 2:
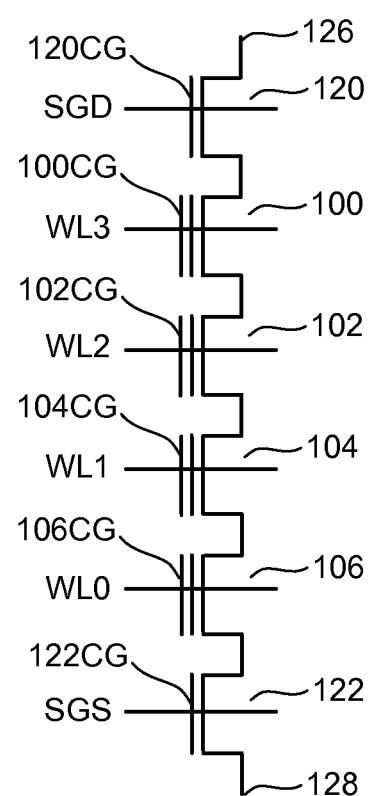
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. Nos. 6,222,762 and 7,237,074, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; 5,774,397; 6,046,935; 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
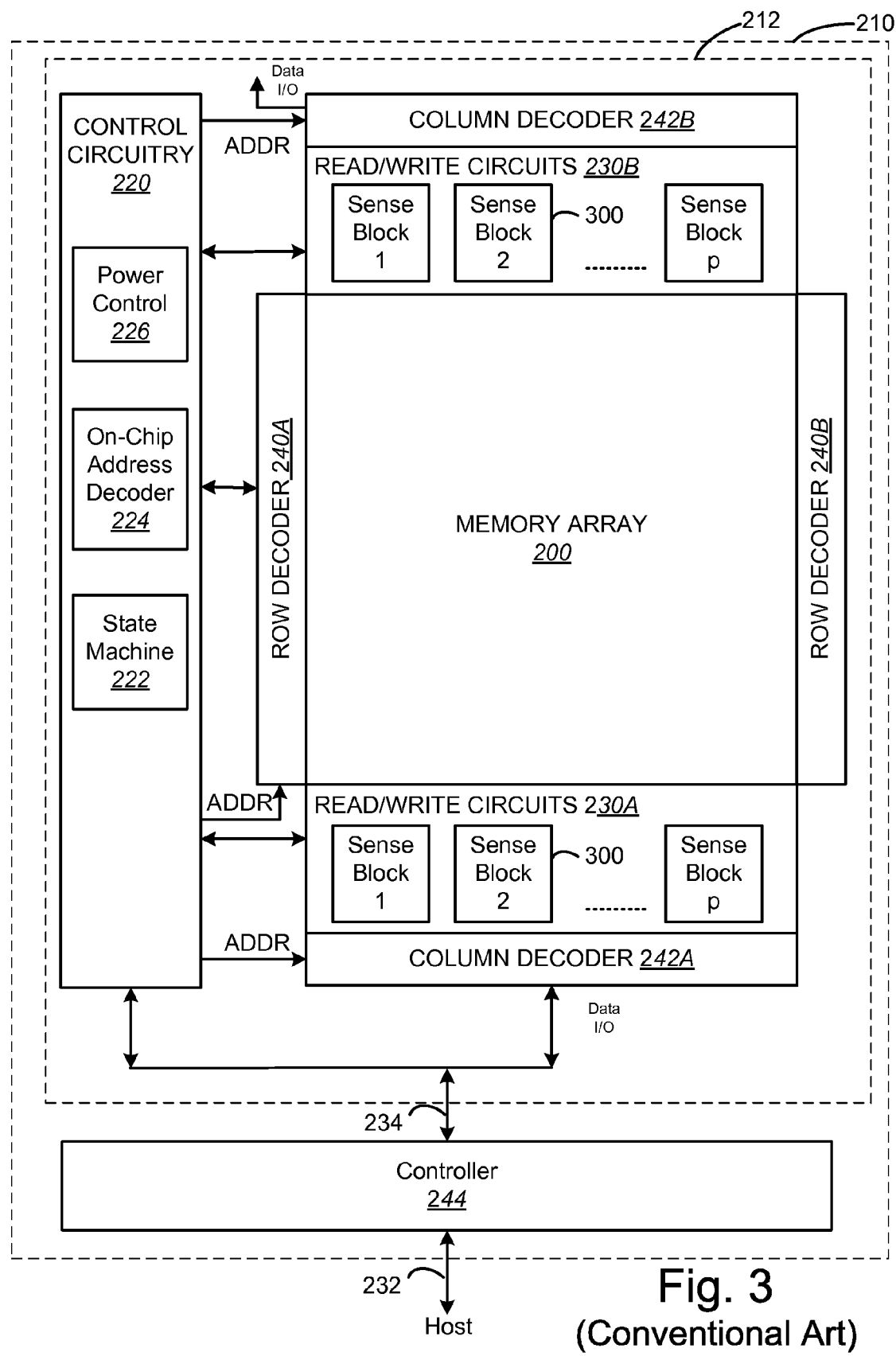
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
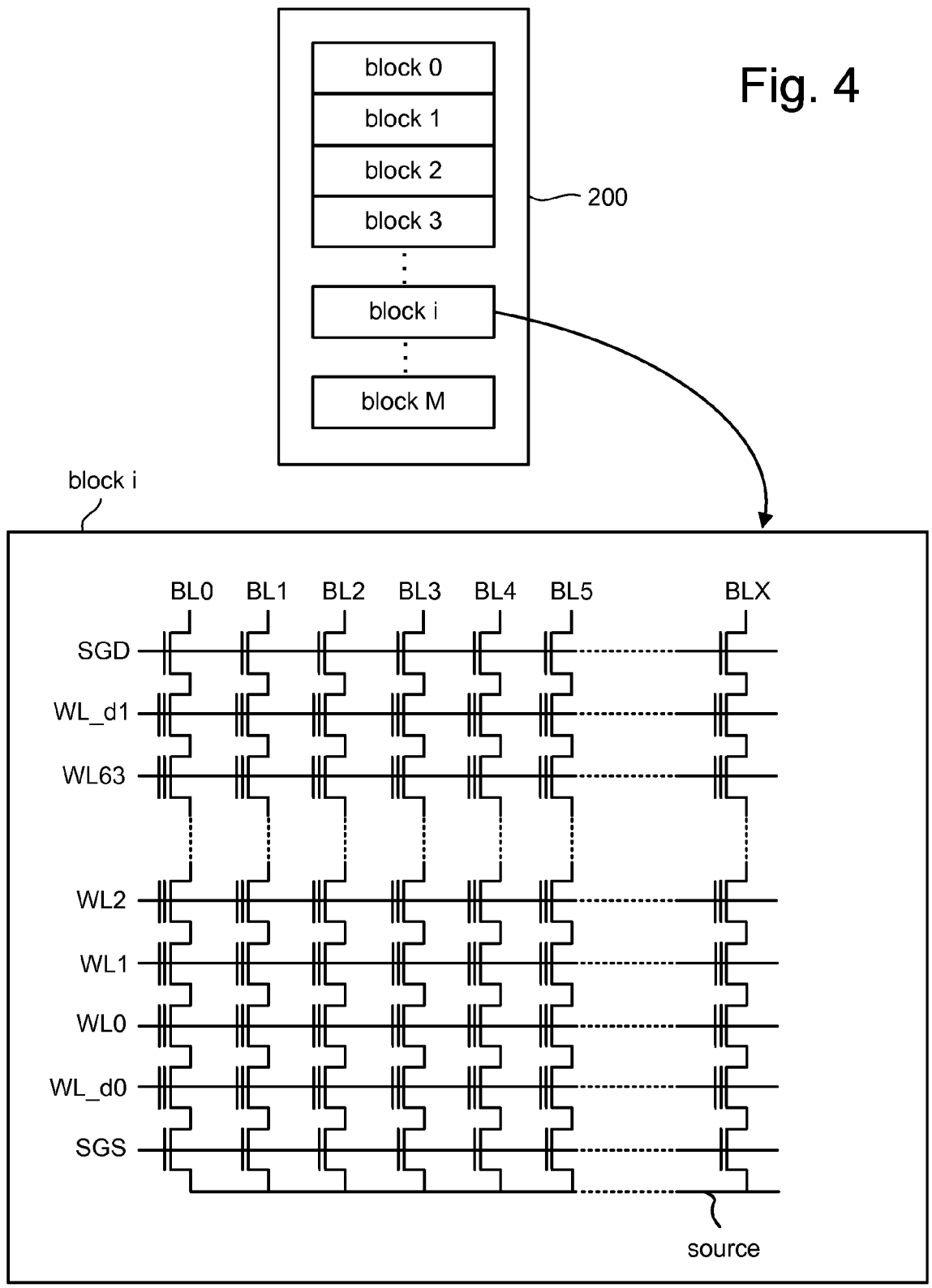
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. For example, a row typically contains several interleaved pages or it may constitute one page. In one implementation, all storage elements of a page will be read or programmed together. A page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), two dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are 64 data word lines and two dummy word lines, each NAND string includes 64 data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments include more or fewer than two dummy memory cells per NAND string.

Figure 5:
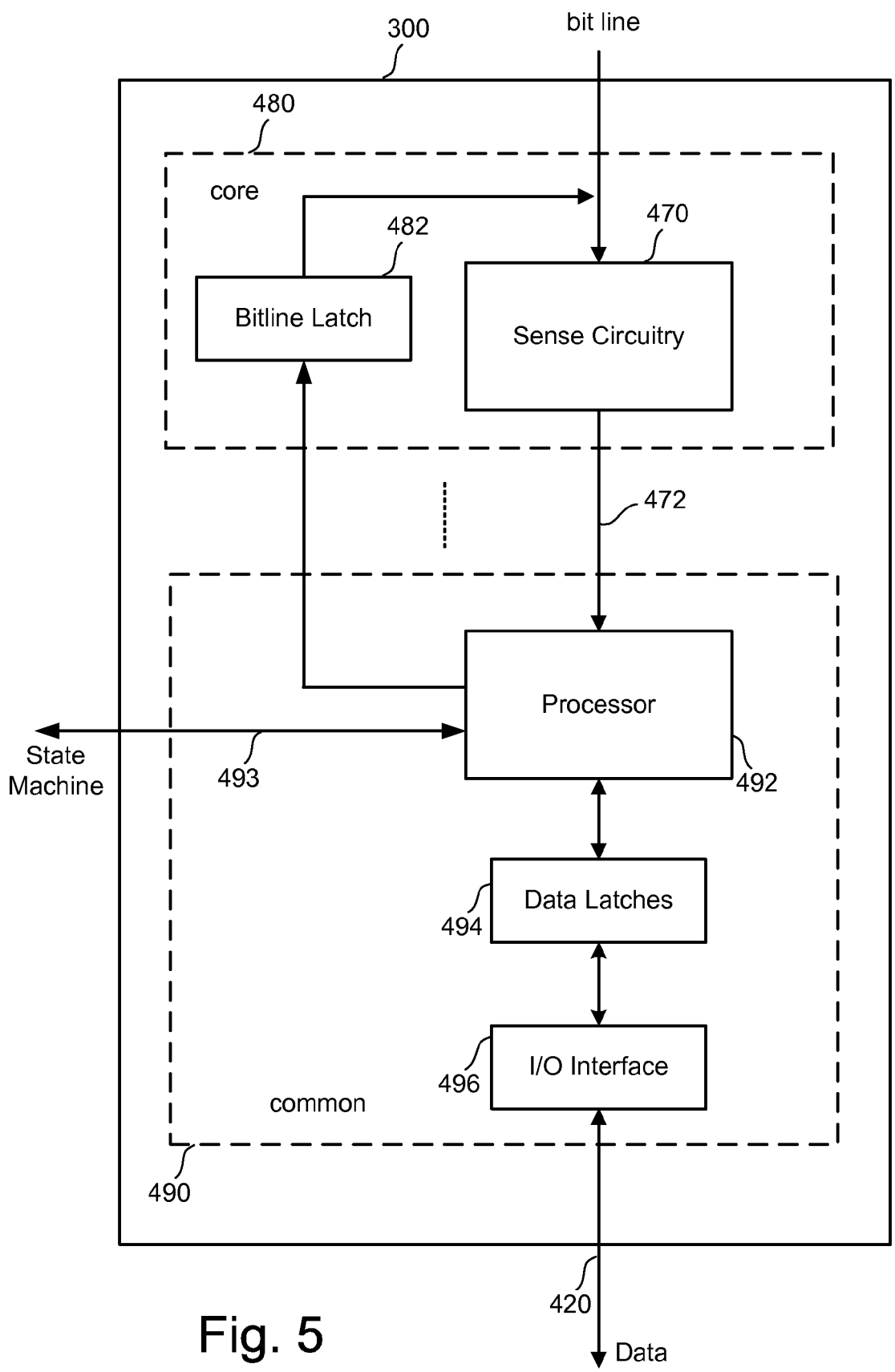
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block 300 will include one common portion 490 and eight sense modules 480. Each of the sense modules 480 in a group will communicate with the associated common portion 490 via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors;" (2) U.S. Pat. No. 7,023,736, "Non-Volatile Memory And Method with Improved Sensing;" (3) U.S. Pat. No. 7,046,568; (4) U.S. Pat. No. 7,196,928, "Compensating for Coupling During Read Operations of Non-Volatile Memory;" and (5) U.S. Pat. No. 7,327,619, "Reference Sense Amplifier For Non-Volatile Memory." All five of the immediately above-listed patent documents are incorporated herein by reference in their entirety.

Figure 6A:
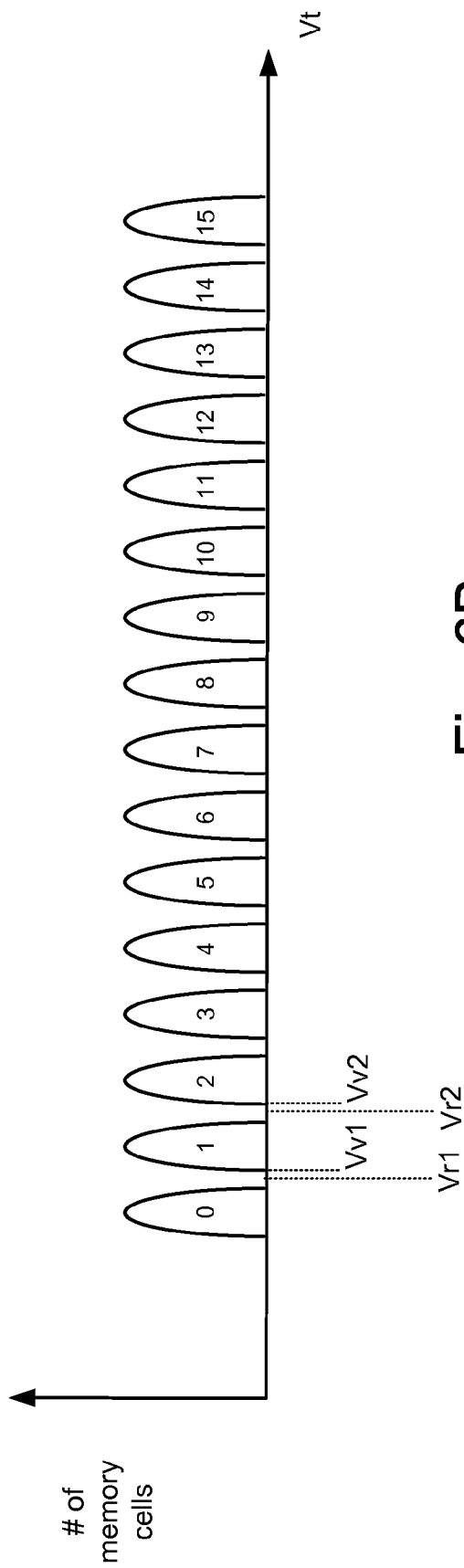
FIG. 6A depicts an example set of Vt distributions.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores four bits of data. Other embodiment, however, may use more or fewer than four bits of data per memory cell. FIG. 6A shows 16 Vt distributions corresponding to data states 0-15. In one embodiment, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6A shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6A shows Vv1 for state 1 and Vv2 for state 2. When programming memory cells to a given state, the system will test whether those memory cells have a threshold voltage greater than or equal to the verify reference voltage.

Figure 6B:
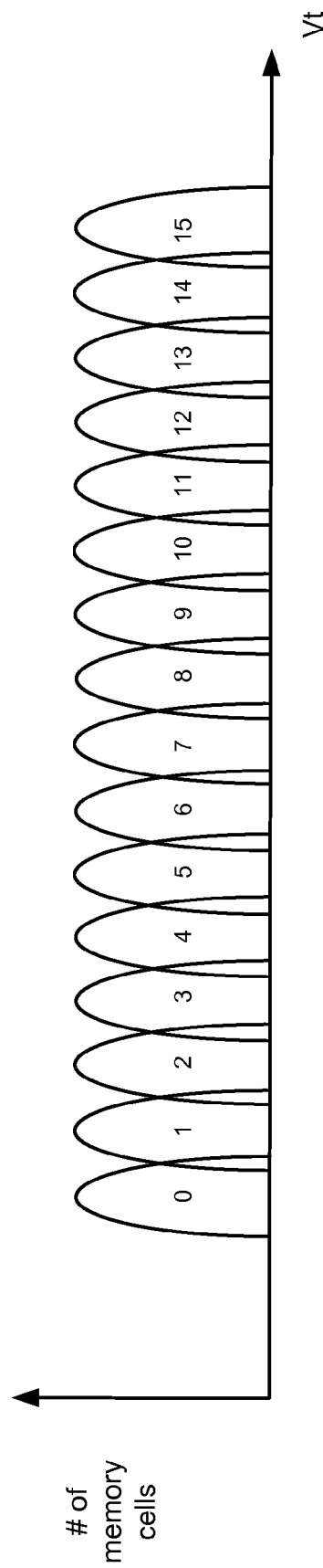
FIG. 6B depicts an example set of Vt distributions.

FIG. 6B illustrates that another embodiment of Vt distributions corresponding to data states 0-15 can partially overlap since the correction algorithm can handle a certain percentage of cells that are in error. A point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

Also note that the Vt axis may be offset from actual voltages applied to the control gates as body effect through source or body biasing is used to shift negative threshold voltage into the measurable positive range.

FIG. 7 is a flow chart describing one embodiment of a process for erasing and programming memory cells. The process of FIG. 7 is performed by the one or more managing circuits described above. In step 702, the system will receive a request to erase data. In one embodiment, it is possible that there will not be a dedicated erase command. Rather, the system will erase (prior to programming) in response to a request to program. In step 704, the blocks to be erased are selected. In step 706, the memory cells are erased.

In step 708 of FIG. 7, the system will receive a request to program data. A dotted line is depicted to connect step 706 to step 708 because there could possibly be a long time lapse between the two steps. In step 710, the memory cells will be programmed. The data memory cells can be programmed in step 710 according to many of various programming methods known in the art. Techniques are disclosed herein for applying one or more programming pulses to a dummy memory cell after nearby data memory cells are programmed. In some embodiments, applying the one or more programming pulse to the dummy compensates for lesser floating gate coupling effect that the dummy's neighbor memory cell experiences during the programming.

Figure 8:
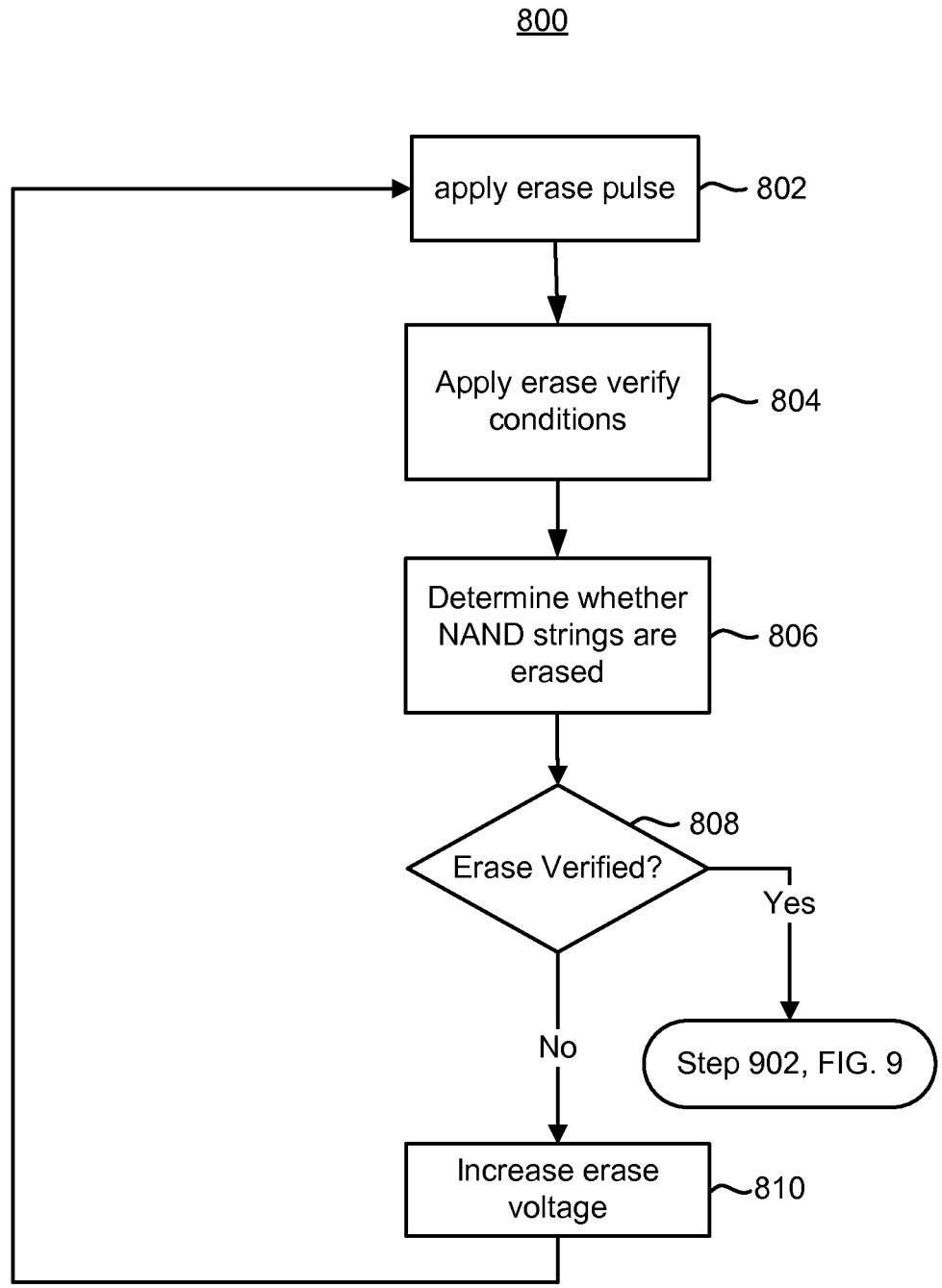
FIG. 8 depicts one embodiment of erasing memory cells.

FIG. 8 is a flow chart describing a process 800 for erasing memory cells and verifying that the memory cells have been erased. In one embodiment, process 800 of FIG. 8 is used following step 704 of process 700. In step 802, one or more erase voltages are applied. In one implementation, step 802 includes raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells.

In step 804, a set of erase verify conditions are applied to the memory cells. In one implementation, step 804 includes discharging bit lines to ground, which may be achieved by turning on the drain side select gate (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string.

In step 806, each of the NAND strings is sensed to determine whether the memory cells on the NAND string were sufficiently erased. Step 806 is performed after waiting for a predetermined period of time for the charge to build up on the bit line. In one implementation, the voltage on a given bit line is compared to a reference value to determine whether any of the memory cells on the corresponding NAND string have a Vt that is above the target value. The target value could be a negative value. In some implementations, the memory cells are erased to as much as −3V.

In one embodiment, if it is detected that the Vt of each memory cell on a NAND string has reached the target level, then the data stored in the corresponding data latch is changed to a logic "1." If it is detected that the NAND string has at least one memory cell with a Vt that has not reached the appropriate target level, the data stored in the corresponding data latch is not changed.

In step 808, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then control passes to step 902 of process 900 of FIG. 9 to perform soft programming to compact the erase distribution.

If, at step 808, it is determined that erase verification failed, then the erase voltage is increased in step 810. The erase voltage can be increased by any desired amount such as 0.2 V, 0.5 V, 1.0 V, etc. The new erase voltage is applied in step 802.

Figure 9:
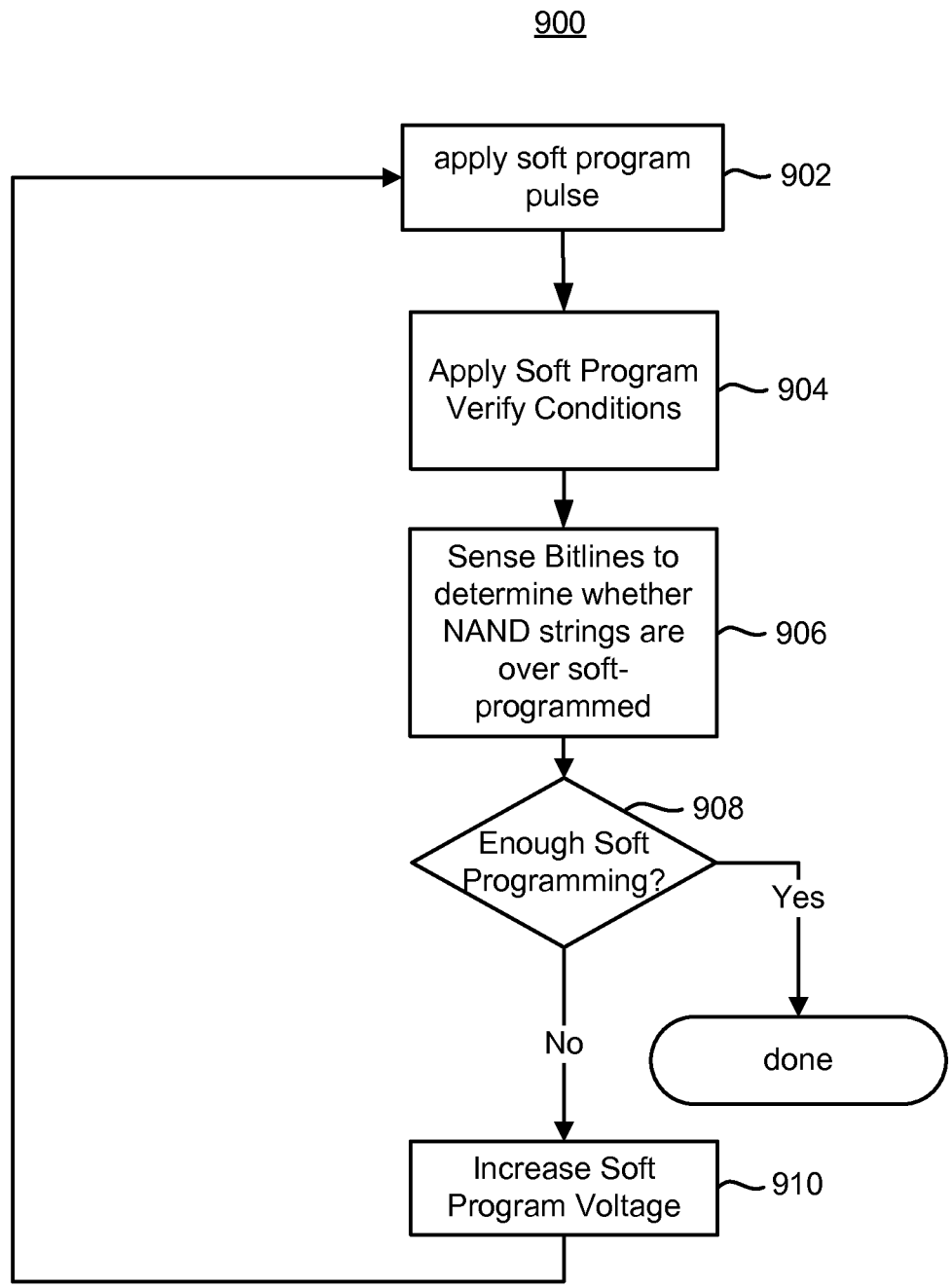
FIG. 9 depicts one embodiment of soft programming memory cells.

FIG. 9 is a flow chart describing a process 900 for soft programming of the memory cells. In one embodiment, the process 900 of FIG. 9 is used if step 808 of process 800 determines that the memory cells have been sufficiently erased. In step 902, one or more soft programming voltages are applied to the memory cells.

In one embodiment, the following parameters are used during step 902. The labels are with reference to FIG. 4 (Cpwell not depicted in FIG. 4). Cpwell refers to the voltage applied to the Pwell. In this embodiment, the same soft program voltage is applied to the dummy word lines (e.g., WL_d1 and WL_d0) and the data word lines (e.g., WL0-WL63).

| | |
|---|---|
| Bitline voltage (BL0, BL1, etc.) | 0 V |
| Source | 0.7 V |
| SGD | Vsg (Vdd + Vt) |
| SGS | 0 V |
| WL_d1 (Drain side Dummy) | Vpgm (soft program) |
| WL0-WL63 | Vpgm (soft program) |
| WL_d0 (Source side Dummy) | Vpgm (soft program) |
| Cpwell | 0 V |

Figure 14:
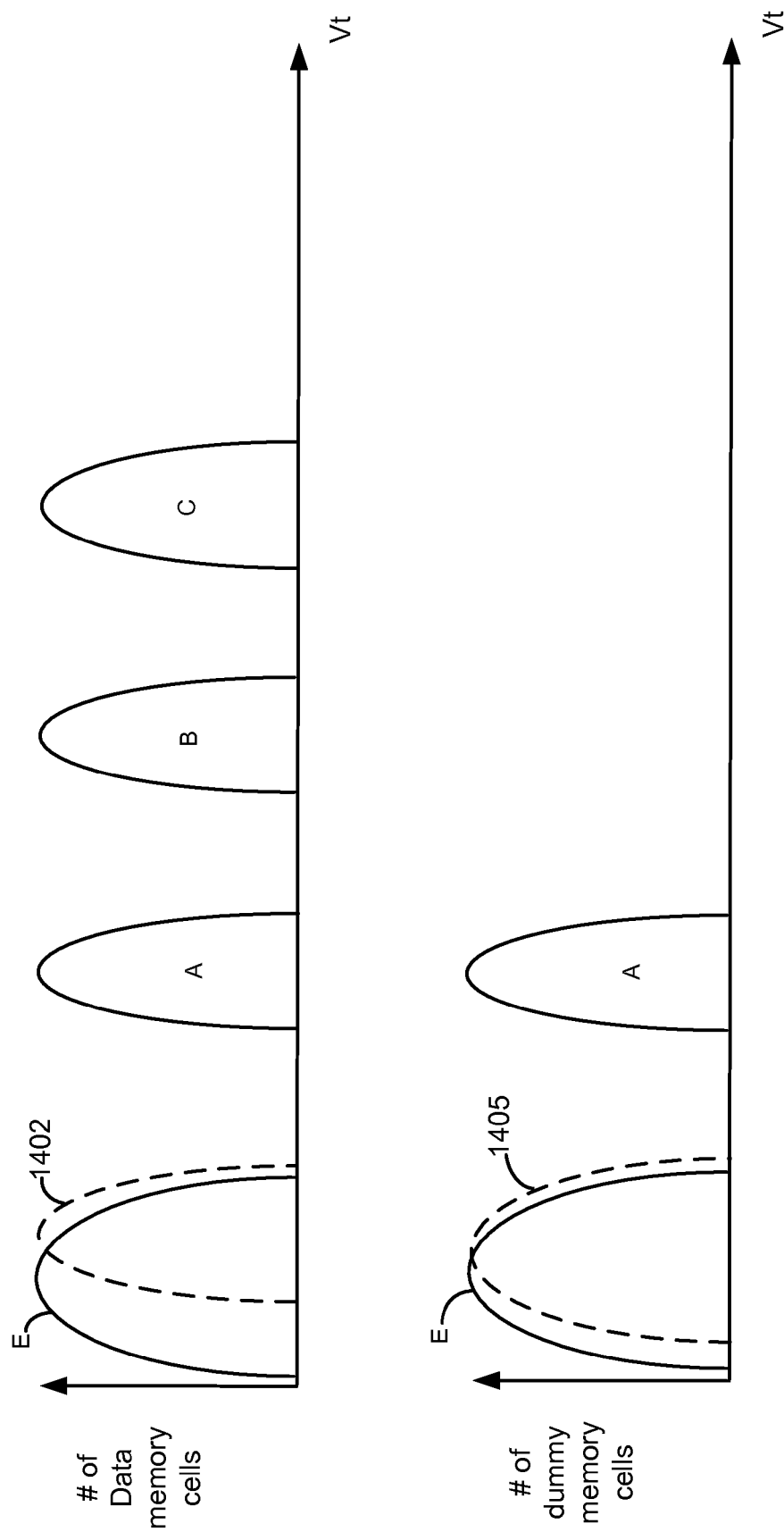
FIG. 14 depicts example threshold distributions for data and dummy memory cells.

In another embodiment, a different soft program voltage is applied to the drain side dummy word line (WL_d1) than to the other word lines. Specifically, a lower soft programming voltage is applied to WL_d1. This results in less soft programming of the memory cells on the dummy word line. FIG. 14 depicts example shifts in threshold voltage distributions for the memory cells on the data word lines and the memory cells on the dummy word lines. For example, referring to FIG. 14, distribution 1402 depicts the change in threshold voltage distribution for data memory cells that results from compacting the erased distribution (E) as a result of soft programming. Distribution 1405 depicts the change in threshold voltage distribution for dummy memory cells that results from soft programming memory cells in the erased distribution (E). Note that the dummy memory cells do not receive much change in their threshold voltages.

As discussed elsewhere herein, one or more program voltages (e.g., pulses) may be applied to a dummy memory cell after the data memory cells are programmed to compensate for lesser floating gate coupling effect experienced by the dummy's neighbor during programming. The following discusses some benefits of having the threshold distribution of the dummy memory cells lower as depicted by distribution 1405. On average, if a dummy memory cell is programmed from somewhere in distribution 1405 to somewhere in program state "A", its threshold voltage is increased by more than if a data memory cell is programmed from compacted erase distribution 1402 to state A. Therefore, more charge is added to the dummy's floating gate, which results in more floating gate coupling effect on its neighbor memory cell. However, the dummy still only needs to be programmed to state A. Therefore, the extra floating gate effect may be achieved with little if any increase in the program voltage and/or number of programming voltages that are applied to the dummy. Consequently, additional floating gate coupling effect may be achieved with minimal, if any, additional program disturb on the data memory cells. As another alternative, the dummy memory cells could be programmed to a threshold voltage that is less than state A and still have the same amount of floating gate coupling effect. However, in this case it may be possible to use a lower program voltage and/or fewer programming voltages. Consequently, it may be possible to achieve the same floating gate coupling effect with less program disturb.

The table below provides example parameter values for one implementation of applying a different soft program voltage to a dummy word line than other word lines. In this example, only the dummy word line that is near the drain side select line (SGD) receives the lower soft program voltage. That is, the dummy word line near the source select gate (SGS) receives the same soft program voltage as the data word lines in this implementation. The reason for this is that in some implementations, WL0 does not suffer from the difference in floating gate coupling effect that WL63 does due to the sequential programming of word lines from WL0 to WL63. However, if desired dummy word line WL_d0 could receive a lower soft program voltage as well.

| | |
|---|---|
| Bitline voltage | 0 V |
| Cell Source | 0.7 V |
| SGD | Vsg (Vdd + Vt) |
| SGS | 0 V |
| WL_d1 (Drain side Dummy) | Less than Vsoft_pgm |
| WL00-WL63 | Vsoft_pgm (soft program) |
| WL_d0 (Source side Dummy) | Vsoft_pgm (soft program) |
| Cpwell | 0 V |

The lower soft program voltage that is applied to the dummy word line can be any convenient voltage that will result in the dummy memory cells staying more deeply erased than the data word lines. As an example, if the data word lines have 15 V applied thereto for soft programming, the dummy word line might have a value anywhere from 0 to 10 V. In some implementations, the voltage is a convenient value that is already available. For example, Vpass could be used. Vpass is about 5V in one implementation.

In step 904, a set of soft program verify conditions are applied to the memory cells. In one implementation, the bit lines are pre-discharged to ground and then a higher than zero voltage (e.g., 2.2V) is applied to the common source line. This causes current to flow from the source to the bit lines causing the bit lines to charge up towards the source line voltage. Charging of the bit lines stops when the body effect turns off at least one of the memory cells in a NAND chain. In some implementations, sensing is performed on a NAND string basis. That is, a determination is made as to whether any of the memory cells on a given NAND string have a threshold voltage above a certain value. However, sensing can be performed on a basis of individual word lines.

In step 906, each of the NAND strings is sensed to determine how many NAND strings have a conduction current that is below a demarcation current. Having a low conduction current indicates that the NAND string has been over soft-programmed. As previously discussed, soft programming is intended to nudge the Vts of memory cells with the lowest Vts upwards without causing memory cells to be programmed to a Vt above a certain level. That level could be the erase target level. However, the level could be a higher voltage. Thus, one technique to verify whether soft programming should stop is to test how many NAND strings have at least one memory cell with a Vt above a certain level. Other techniques can be used to determine when to stop soft programming. Step 906 is performed after waiting for a predetermined period of time for the charge to build up on the bit lines. In one implementation, the voltages on the bit lines are compared to a reference value to determine whether any of the NAND strings have been programmed too far.

Note that in the embodiment in which the dummy word lines are programmed with a lower soft program voltage, the dummy memory cells should not have their threshold voltages increased substantially. Therefore, in general it should be the data memory cells that are the ones that are over soft-programmed. However, it is possible that a dummy memory cell could be the one that causes a NAND string to be over soft-programmed.

In step 908, a determination is made whether to stop soft programming based on the results of step 906. For example, a determination is made as to how many NAND strings have a conduction current that is below a demarcation current. If too many NAND strings have a low conduction current, then soft programming should stop. If soft programming should stop, then the process 900 finishes.

If, at step 908, it is determined that further soft programming is desired, then the soft programming voltage is increased in step 910. The soft programming voltage can be increased by any desired amount such as 0.1 V, 0.2 V, etc. The new soft programming voltage is applied in step 902.

The soft programming process 900 was described as programming each NAND string in the block until the process completes. However, it is not required that each NAND string continue to receive programming throughout the process. In one embodiment, whenever a given NAND string has been sufficiently programmed, it is locked out from further programming.

Figure 10:
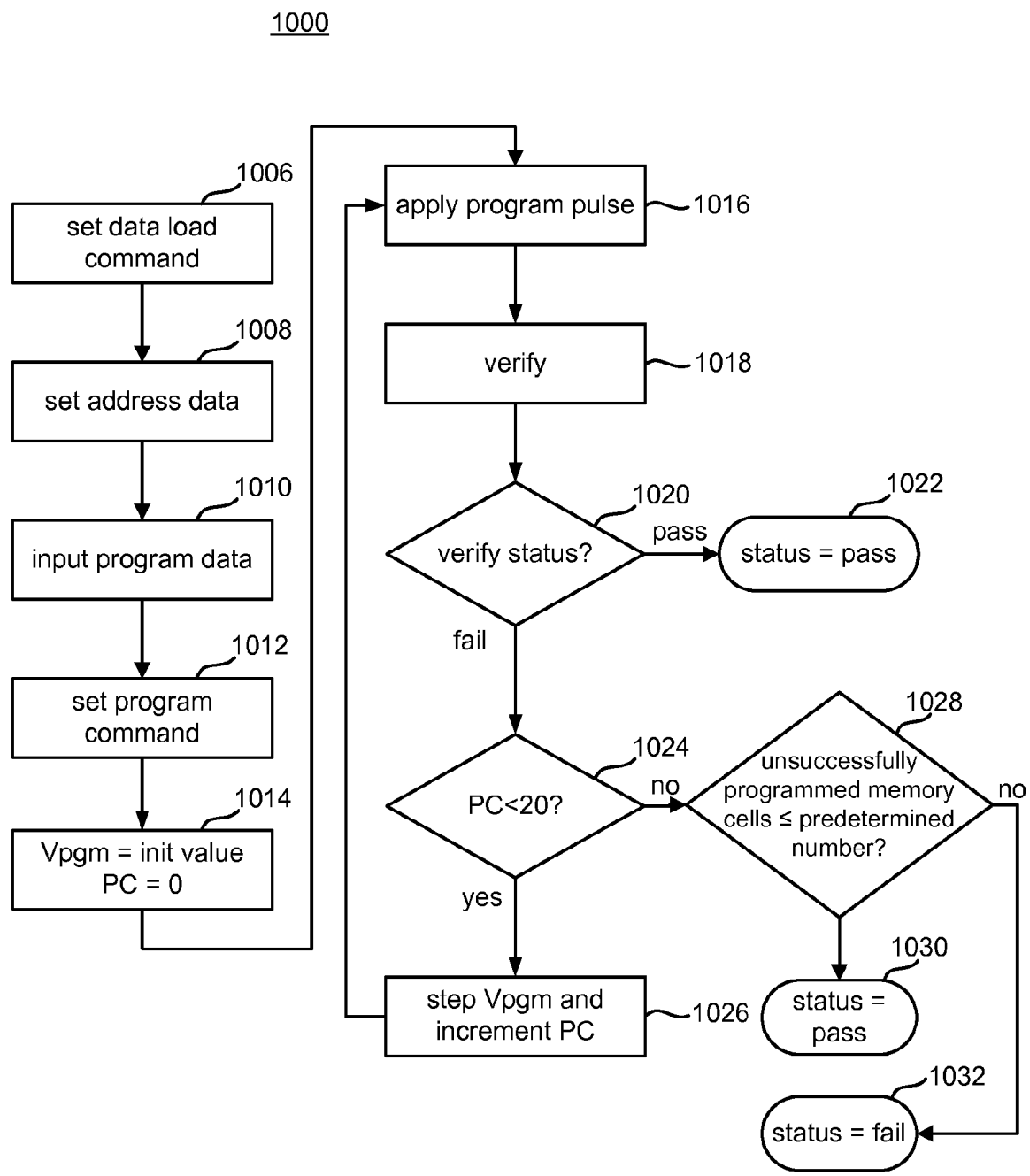
FIG. 10 is a flow chart describing one embodiment of a process for programming memory cells connected to a selected word line.

FIG. 10 is a flow chart describing one embodiment of a process 1000 for programming memory cells connected to a selected word line. In one embodiment, the process of FIG. 10 is used to program one page of data. Thus, the process of FIG. 10 can be used multiple times to program the different pages in a block being written in step 710 of process 700.

In one implementation of the process of FIG. 10, memory cells are erased prior to programming. Process 800 of FIG. 8 may be used to erase the memory cells. Then, process 900 of FIG. 9 may be used to soft program the memory cells to compact the erase distribution. Erasing can be performed on the entire memory array, on individual blocks, or another unit of cells. After a block of memory cells is erased, the various memory cells can be programmed or partially programmed as described herein. Note that the erasing would not need to be performed before each word line of a block is programmed. Rather, the block can be erased and then each word line can be programmed without erasing between the programming of the word lines.

At step 1006, a "data load" command is issued by controller 244 and input to state machine 222. At step 1008, address data designating the page address is provided to the decoder 224. At step 1010, a page of program data for the addressed page is input for programming. For example, 528 bytes of data could be input in one embodiment. That data is latched in the appropriate registers/latches for the selected bit lines. In some embodiments, the data is also latched in a second register for the selected bit lines to be used for verify operations. At step 1012, a "program" command is received from controller 244 and provided to state machine 222.

Triggered by the "program" command, the data latched in step 1010 will be programmed into the selected memory cells controlled by state machine 222 using the voltages applied to the appropriate word line. At step 1014, a programming signal, "Vpgm," (e.g., a series of voltage pulses) is initialized to the starting magnitude (e.g., ~12V or another suitable level) and a program counter PC maintained by state machine 222 is initialized at 0. At step 1016, a pulse of the programming signal Vpgm is applied to the selected word line. The unselected word lines receive one or more boosting voltages, referred to as "Vpass". If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming. Note that the programming signal includes a set of voltage pulses, where the magnitude of the pulses increases with each successive pulse. In between voltage pulses are a set of verify pulses.

At step 1018, the states of the selected memory cells are verified using the appropriate set of target levels, as discussed above. If it is detected that the threshold voltage of a selected cell has reached the appropriate target level, then the data stored in the corresponding data latch is changed to a logic "1." If it is detected that the threshold voltage has not reached the appropriate target level, the data stored in the corresponding data latch is not changed. In this manner, a bit line having a logic "1" stored in its corresponding data latch does not need to be programmed. When all of the data latches are storing logic "1," the state machine 222 knows that all selected cells have been programmed. At step 1020, it is checked whether all of the data latches are storing logic "1." If so, the programming process is complete and successful because all selected memory cells were programmed and verified to their target states. A status of "PASS" is reported at step 1022. Note that in some implementations, at step 1020 it is checked whether at least a predetermined number of data latches are storing a logic "1." This predetermined number can be less than the number of all data latches, thereby allowing the programming process to stop before all memory cells have reached their appropriate verify levels. The memory cells that are not successfully programmed can be corrected using error correction during the read process.

If, at step 1020, it is determined that not all of the data latches are storing logic "1," then the programming process continues. At step 1024, the program counter PC is checked against a program limit value. One example of a program limit value is 20; however, other values can be used in various implementations. If the program counter PC is not less than the program limit value, then it is determined at step 1028 whether the number of memory cells that have not been successfully programmed is equal to or less than a predetermined number. If the number of unsuccessfully programmed memory cells is equal to or less than the predetermined number, then the programming process is flagged as passed and a status of PASS is reported at step 1030. In many cases, the memory cells that are not successfully programmed can be corrected using error correction during the read process. If however, the number of unsuccessfully programmed memory cells is greater than the predetermined number, the program process is flagged as failed and a status of FAIL is reported at step 1032. If in step 1024 it is determined that the program counter PC is less than the program limit value (e.g., 20), then the magnitude of the next Vpgm voltage pulse is increased by the step size (e.g., 0.1-0.5 volt step size) and the program counter PC is incremented at step 1026. After step 1026, the process loops back to step 1016 to apply the next Vpgm voltage pulse.

In general, during verify operations (such as the verify operations performed during step 1018 of FIG. 10) and read operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

Figure 11:
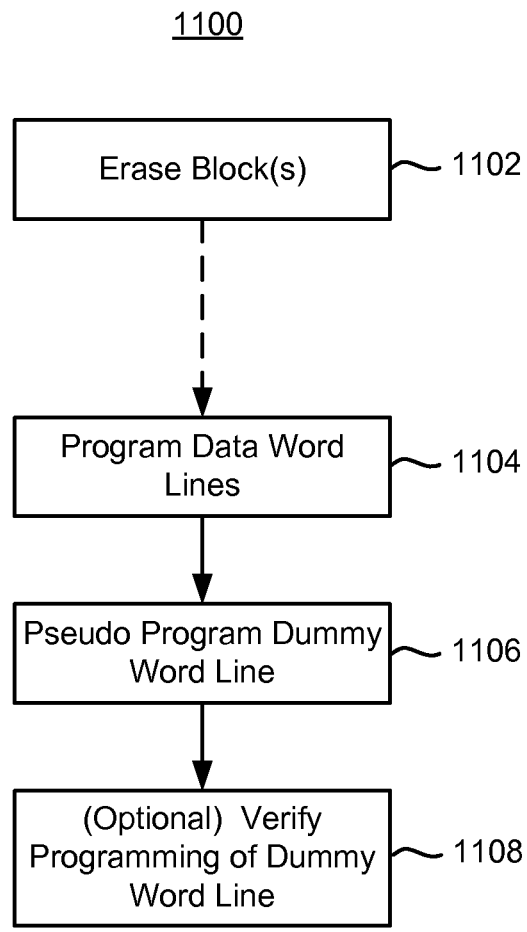
FIG. 11 depicts one embodiment of operating non-volatile memory cells.

FIG. 11 depicts one embodiment of operating non-volatile memory cells. In step 1102, memory cells are erased. Process 800 of FIG. 8 may be used to erase the memory cells. Then, process 900 of FIG. 9 may be used to soft program the memory cells to compact the erase distribution. Typically, one or more blocks of memory cells are erased at one time.

In step 1104, data word lines are programmed. In one implementation, the data word lines are programmed sequentially from WL0 to WL63. FIG. 11 depicts one embodiment of a process 1100 for programming memory cells that are associated with a word line. Process 1100 may be performed one or more times for each data word line. For example, process 1100 is used to program one page of data. A given word line may have one or more pages. Thus, process 1100 may be used to program a page of data on WL0, then another page of data on WL1, etc. until WL63 is programmed. However, it is not required that programming proceeds sequentially from WL0 to WL63.

In step 1106, pseudo programming of a dummy word line is performed. For example, WL_d1 is pseudo programmed. By pseudo programming it is meant that one or more programming voltages are applied to a dummy word line as if the memory cells were being programmed. Therefore, the charge on the floating gates of the dummy memory cells, as well as their threshold voltages, are affected. Moreover, the programming voltages may be intended to result in a certain threshold voltage. However, data is not stored in the dummy memory cells. Herein, the term "pseudo" program voltage or the like refers to a voltage that is applied to a dummy word line when pseudo programming the memory cells of a dummy word line.

Figure 12:
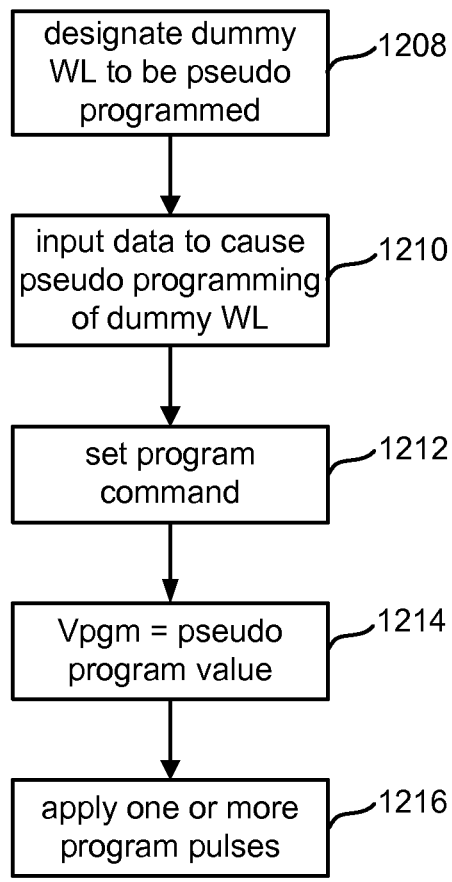
FIG. 12 depicts one embodiment of applying a single pseudo programming voltage to a dummy word line.

In one embodiment, a single programming voltage is applied to the dummy word line. However, more than a single programming voltage can be applied to the dummy word line. Process 1200 of FIG. 12 depicts one embodiment of applying one or more single programming voltages of a dummy word line. No verification needs to be performed in this case (i.e., step 1108 is not performed).

Figure 13:
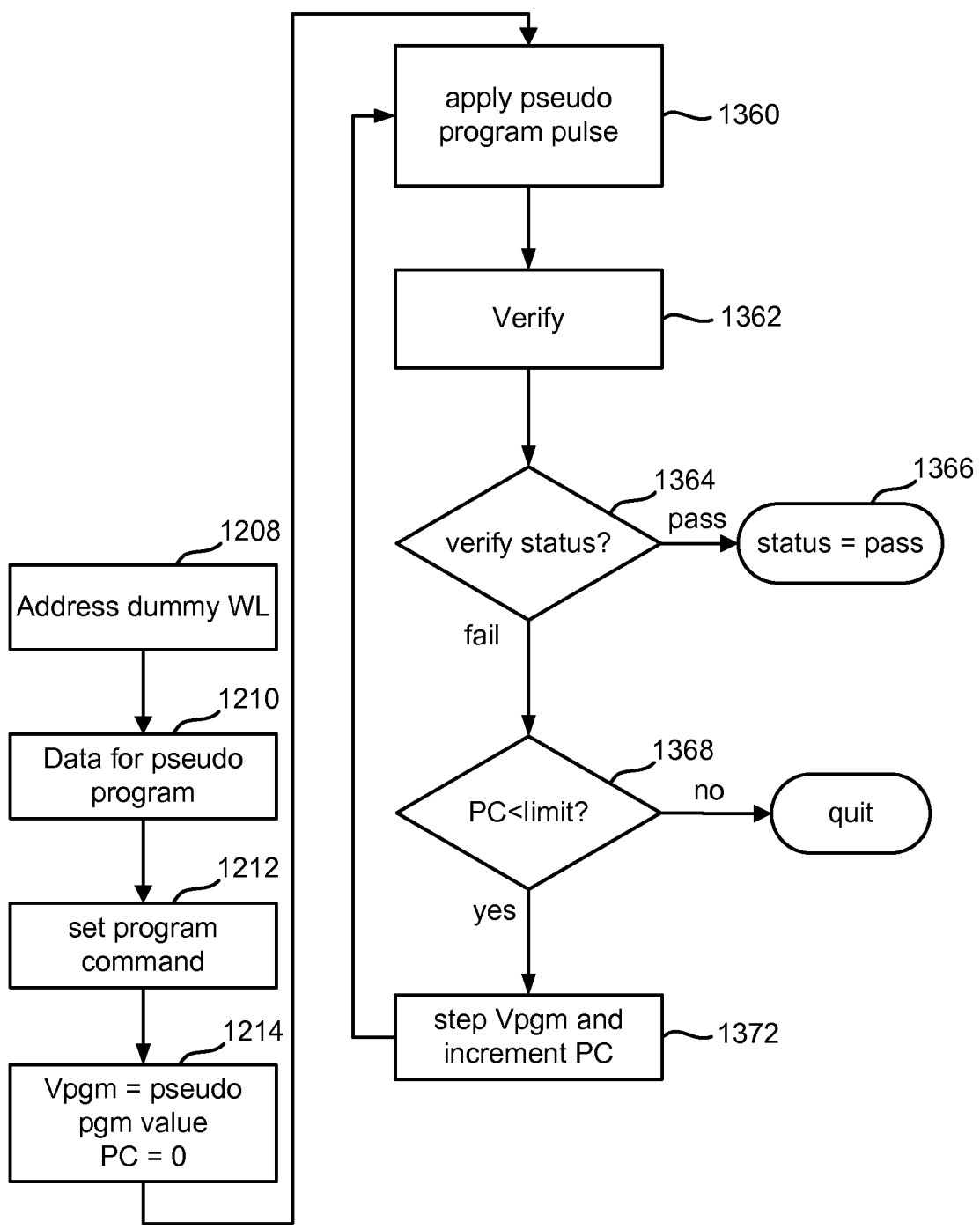
FIG. 13 depicts one embodiment of a process for pseudo programming dummy memory cells, along with verifying the threshold voltage of the dummy memory cells.

In optional step 1108, the pseudo programming of the dummy word line is verified. Process 1300 of FIG. 13 depicts one embodiment of pseudo programming of a dummy word line, along with verifying that the threshold voltages of the dummy memory cells has reached a target level.

Process 1200 of FIG. 12 depicts one embodiment of applying a single programming voltage to a dummy word line. At step 1208, address data designating that the dummy word line is to be programmed is provided to the decoder 224.

At step 1210, "pseudo" program data for the dummy word line is input for programming. Note that the goal is not to program particular data into the dummy memory cells, but to raise the threshold voltages to some target level. Thus, the purpose of the pseudo program data is to ensure that bit lines associated with dummy memory cells are not inhibited from programming. For example, in one implementation, logic "0" is stored in each data latch indicating that the corresponding dummy memory cell should be "pseudo programmed." On the other hand, in one implementation, had logic "1" been stored in a given data latch, then programming of the corresponding dummy memory cell would be inhibited, which is not desired.

At step 1212, a program command is received from controller 244 and provided to state machine 222. Triggered by the program command, the threshold voltage of the dummy memory cells will be increased under control of state machine 222 using the voltage applied to the dummy word line.

At step 1214, a programming signal, "Vpgm," (e.g., a single voltage pulse) is initialized to the starting magnitude (e.g., a range between 0 and 10V or another suitable level). The pseudo programming voltage is not necessarily the same magnitude of the first programming voltage used in process 1000. In one implementation, the pseudo programming voltage is significantly lower in magnitude than the first programming voltage used in process 1000. Other magnitudes can also be used.

The rationale for determining a suitable weak programming voltage may be as follows. Memory cells on the last data word line (e.g., WL63) that is programmed may not receive as much floating gate coupling effect as memory cells on other word lines if the dummy word line is kept in an erased state. For example, a memory cell on WL 63 has three neighbor cells on WL62, three neighbor dummy memory cells on the dummy word line, and two neighbor cells on WL 63. If the dummy memory cells are kept in the erase state, then the memory cells on WL63 will not experience any floating gate coupling effect due to a change in the charge on the floating gate of the dummy memory cells.

In one implementation, word lines are programmed sequentially from WL0 to WL63. In this implementation, as each successive word line is programmed, the memory cells on the previous word line will experience some amount of floating gate coupling effect. For example, first the memory cells on WL0 are programmed and verified to be at their target levels. Next, memory cells on WL1 are programmed and verified to their respective target levels. The target levels will depend on the data to be stored. Thus, the programming of the memory cells on WL1 alters the charge on the floating gates of those memory cells. In one implementation, it is expected that on average a memory cell on WL0 will have its threshold voltage increased by about 0.2 V due to the programming of WL1. Note that this is an average value and will vary depending on the actual amount of charge added (or removed) from floating gates of memory cells on WL1.

However, note that after programming memory cells on WL63, there is not another data word line to program. Therefore, if the memory cells on the dummy word line are kept in the erased state, then the memory cells on WL63 will not experience the previously discussed apparent increases in threshold voltage due to programming memory cells on WLn+1.

One technique that might be used to compensate for the difference in floating gate coupling effect that is experienced by memory cells on the last word line is to increase the threshold voltage of the memory cells on the last word line. For example, when programming a memory cell on WL63 to a given state, its threshold voltage can deliberately be established about 0.2 V higher than other memory cells that are programmed to that state. However, programming the memory cells to the higher threshold voltage may take additional programming voltages. Thus, programming the memory cells on WL63 may take longer than memory cells on other word lines. Moreover, increasing the threshold voltage may result in increasing the number of electrons in memory cells on WL63. From the electron field point of view, the memory cells on the last word line have a higher field than memory cells on other word lines (for the same program state). Note that if the floating gate of a given memory cell has more electrons than others, it may suffer from data retention to a greater extent. That is, the rate of charge loss on a floating gate may be proportional to the amount of charge on the floating gate.

However, if the threshold voltage of the dummy memory cells is increased from the erased state after the memory cells on the last word line (i.e., neighbor WL to dummy WL) have been programmed, then the memory cells on the last word line will receive some floating gate coupling effect. That is, the last memory cells will have their apparent threshold voltage increased by some amount. That amount can be selected such that the last memory cells will experience about the same apparent increase in threshold voltage due to floating gate coupling effect as the memory cells on the other word lines will receive on average due to programming.

Based on engineering qualification of the memory device, a determination can be made as to how much the threshold voltage of the dummy memory cells will be expected to change for a given programming voltage. In practice, some memory cells may "faster" or "slower" than others. That is, some memory cells may experience a larger change in threshold voltage for a given program voltage than others.

At step 1216, one or more pulses of the programming signal Vpgm is applied to the dummy word line. In one implementation, a single pulse is applied. In another implementation, more than one pulse is applied. When more than one pulse is applied, the magnitude of each of the pulses may be the same. Alternatively, the pulses may have a different magnitude from each other. The unselected word lines may receive one or more boosting voltages, referred to as "Vpass." Because logic "0" was stored in each data latch, each bit line is grounded. In other words, none of the bit lines are connected to $V_{DD}$ to inhibit programming, which would be the case had logic "1" been stored in a given latch.

In this implementation, no verification that the dummy memory cells threshold voltages reached a given level is performed. Thus, programming the dummy word line is a very efficient process.

FIG. 13 depicts one embodiment of a process 1300 for pseudo programming dummy memory cells, along with verifying the threshold voltage of the dummy memory cells. The dummy memory cells are programmed to a target level that is designed to compensate for the lower floating gate coupling effect that would otherwise be experienced by memory cells on the word line next to the dummy word line. The target threshold voltage for process 1300 may be similar to the target threshold voltage of process 1200. That is, the target is selected to increase the apparent threshold voltage of the memory cells on the last word line by a target amount.

In one embodiment, WL_d1 (the dummy next to the drain side select line SGD) is programmed. It may not be necessary to program memory cells associated with the dummy word line (WL_d0) next to the source side select gate line (SGS). This may be because memory cells on WL0 may experience significant floating gate coupling when memory cells on WL1 are later programmed. However, depending on the programming sequence, it may be beneficial to apply the pseudo program voltage to the source side dummy word line (WL_d0). Steps 1208-1214 are the same as that of process 1200 of FIG. 12. In step 1360, the pseudo program voltage is applied to the dummy word line. The pseudo programming voltage is selected such that a target threshold voltage level is unlikely to be overshot.

In step 1362, the threshold voltage of the dummy memory cells are verified. In one implementation, the target level corresponds to one of the data states. For example, referring to FIG. 6A the target level could be the target verification level for any of states 0 through 15. Two specific verification levels (Vv1 and Vv2) are depicted for data states 1 and 2, respectively. Note that in some implementations, there are more or fewer data states. For example, in one implementation, there are four states: an erased state (E) and three states to which memory cells are programmed (A, B, C). However, the target level does not necessarily correspond to the verification level for one of the data states. For example, it may be determined that to achieve the amount of floating gate coupling desired, that the dummy memory cells should be programmed to a threshold voltage that is quite close to the verification level for one of the data states. In this case, the corresponding verification level can be used. However, in some cases, there will not be a data state verify level that is close to the target threshold level for the dummy, in which case a separate dummy threshold voltage verify level can be established.

If it is detected in step 1362 that the threshold voltage of a given dummy cell has reached the appropriate target level, then the data stored in the corresponding data latch is changed to logic "1." If it is detected that the threshold voltage has not reached the appropriate target level, the data stored in the corresponding data latch is not changed. In this manner, a bit line having logic "1" stored in its corresponding data latch does not need to be programmed. When all of the data latches are storing logic "1," the state machine 222 knows that all dummy cells have been pseudo programmed.

At step 1364, it is checked whether all of the data latches are storing logic "1." If so, the pseudo dummy programming process is complete because all selected dummy memory cells were programmed and verified to the desired threshold voltage to cause the desired amount of floating gate coupling effect on the memory cells on the neighboring word line (e.g., WL63). A status of "PASS" is reported at step 1366. Note that in some implementations, at step 1364 it is checked whether at least a predetermined number of data latches are storing a logic "1." This predetermined number can be less than the number of all data latches, thereby allowing the programming process to stop before all dummy memory cells have reached their appropriate verify levels. This allows the process to complete more quickly in some cases.

If, at step 1364, it is determined that not all of the data latches are storing logic "1," then the pseudo programming process continues. At step 1368, the program counter PC is checked against a program limit value. One example of a program limit value is 20; however, other values can be used in various implementations. If in step 1368 it is determined that the program counter PC is greater than the program limit value (e.g., 20), then the process ends. Because the dummy memory cells are not used to store data, it is not possible for data to be misread from the dummy word lines. However, the amount of floating gate coupling effect on the memory cells on the neighbor word lines may not be as great as desired.

If however, in step 1368 it is determined that the program counter PC is less than the program limit value (e.g., 20), then the magnitude of the next Vpgm voltage is increased by the step size (e.g., 0.2-0.4 volt step size) and the program counter PC is incremented at step 1372. After step 1372, the process loops back to step 1360 to apply the next Vpgm voltage pulse.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

The above examples are provided with respect to NAND type flash memory. However, the principles of the present invention have application to other types of non-volatile memories, including those currently existing and those contemplated to use new technology being developed. For example, in one implementation, the memory cells are MONOS (metal-oxide-nitride-oxide-silicon). For a MONOS device, floating gate coupling effects may be a much smaller problem than with NAND devices. However, a MONOS device may suffer from a channel to adjacent charge trap layer (CTL) coupling effect. The channel to adjacent CTL problem in MONOS may be similar to a channel to floating gate coupling problem in NAND. For example, if the CTL of memory cell n+1 is programmed after the CTL of memory cell n, then the threshold voltage of memory cell n may be increased. Embodiments of the present invention reduce or eliminate this channel to adjacent CTL problem.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device comprising:
   a plurality of non-volatile storage elements, a set of the plurality of non-volatile storage elements includes data non-volatile storage elements and a dummy non-volatile storage element, the dummy non-volatile storage element is a neighbor to one of the data non-volatile storage elements; and
   a managing circuit in communication with the plurality of non-volatile storage elements, the managing circuit performs an erase of the plurality of non-volatile storage elements, the managing circuit programs the data non-volatile storage elements, at least some of the data non-volatile storage elements experience an apparent increase in threshold voltage due to coupling that occurs due to subsequent programming of another of the data non-volatile storage elements by the managing circuit, the managing circuit selects a programming voltage to apply to the dummy non-volatile storage elements to increase the threshold voltage of the dummy non-volatile storage element to a target threshold voltage level that compensates for lesser coupling experienced by the neighbor non-volatile storage element during programming of the other data non-volatile storage elements, the managing circuit applies the programming voltage to the dummy non-volatile storage element after programming the data non-volatile storage elements, the programming voltage increases the threshold voltage of the dummy non-volatile storage element to the target threshold voltage level that compensates for lesser coupling experienced by the neighbor non-volatile storage element during programming of the other data non-volatile storage elements, wherein the managing circuit soft programs the plurality of non-volatile storage elements after performing the erase and prior to programming the data non-volatile storage elements, the soft programming includes the managing circuit applying a first soft program voltage to the data non-volatile storage elements while the managing circuit applies a second soft program voltage to the dummy non-volatile storage element, the second soft program voltage is less than the first soft program voltage.

2. The non-volatile storage device of claim 1, wherein the managing circuit applies only a single programming pulse to the dummy non-volatile storage element.

3. The non-volatile storage device of claim 1, wherein the managing circuit verifies whether the dummy non-volatile storage element has been programmed to the target threshold voltage level, the managing circuit applies one or more additional programming voltages to the dummy non-volatile storage element if the dummy non-volatile storage element has not reached the target threshold voltage level, the managing circuit repeats the verifying and applying one or more additional programming voltages until the managing circuit verifies that the dummy non-volatile storage element has been programmed to the target threshold voltage level.

4. The non-volatile storage device of claim 1, wherein the managing circuit applying a programming voltage to the dummy non-volatile storage element includes the managing circuit applying at least one soft programming voltage to the dummy non-volatile storage element.

5. The non-volatile storage device of claim 4, wherein the managing circuit verifies whether the dummy non-volatile storage element has been programmed to the target threshold voltage level, the verifying includes the managing circuit performing a soft program verify.

6. The non-volatile storage device of claim 1, wherein the set of non-volatile storage elements is associated with a drain side select element, the dummy non-volatile storage element is between the drain side select element and the neighbor non-volatile storage element.

7. The non-volatile storage device of claim 6, wherein the managing circuit programming the data non-volatile storage elements includes the managing circuit programming the data non-volatile storage elements sequentially towards the drain side select element.

8. A non-volatile storage device comprising:
   a plurality of NAND strings, a NAND string having a plurality of data non-volatile storage elements and a dummy non-volatile storage element, the dummy non-volatile storage element is a neighbor to one of the data non-volatile storage elements; and a managing circuit in communication with the plurality of NAND strings, the managing circuit performs an erase of the plurality of NAND strings, the managing circuit programs a first of the NAND strings, as a part of the programming the managing circuit applies one or more programming voltages to the data non-volatile storage elements, at least some of the data non-volatile storage elements experience an apparent increase in threshold voltage due to floating gate coupling that occurs due to subsequent programming of another of the non-volatile storage elements, as a part of the programming the managing circuit verifies that each of the data non-volatile storage elements has been programmed to a target threshold voltage for the respective data non-volatile storage element, the managing circuit selects at least one programming voltage to apply to the dummy non-volatile storage elements to increase the threshold voltage of the dummy non-volatile storage element to a target threshold voltage level that compensates for lesser coupling experienced by the neighbor non-volatile storage element during programming of the other data non-volatile storage elements, as a part of the programming the managing circuit applies the at least one programming voltage to the dummy non-volatile storage element after verifying that each of the data non-volatile storage elements has been programmed to the target threshold voltage for the respective non-volatile storage element, the at least one programming voltage increases the threshold voltage of the dummy non-volatile storage element to the target threshold voltage level that compensates for lesser floating gate coupling experienced by the neighbor non-volatile storage element during programming of the other data non-volatile storage elements, wherein the managing circuit soft programs the first NAND string after performing the erase and prior to programming the data non-volatile storage elements, as a part of the soft programming the managing circuit applies a first program voltage to the data non-volatile storage elements while applying a second program voltage to the dummy non-volatile storage element, the second program voltage is less than the first program voltage.

9. The non-volatile storage device of claim 8, wherein the managing circuit applies only a single programming pulse to the dummy non-volatile storage element.

10. The non-volatile storage device of claim 8, wherein the managing circuit verifies whether the dummy non-volatile storage element has been programmed to the target threshold voltage level, the managing circuit applies one or more additional programming voltages to the dummy non-volatile storage element if the dummy non-volatile storage element has not reached the target threshold voltage level, the managing circuit repeats the verifying and applying one or more additional programming voltages until it is verified that the dummy non-volatile storage element has been programmed to the target threshold voltage level.

11. The non-volatile storage device of claim 8, wherein as a part of applying a programming voltage to the dummy non-volatile storage element the managing circuit applies at least one soft programming voltage to the dummy non-volatile storage element.

12. The non-volatile storage device of claim 11, wherein the managing circuit verifies whether the dummy non-volatile storage element has been programmed to the target threshold voltage level, the verifying includes performing a soft program verify.

13. A non-volatile storage device comprising:
a plurality of data word lines having a last word line;
a drain side select line;
a source side select line;
a dummy word line between the drain side select line and the last word line;
a NAND string having a plurality of data non-volatile storage elements associated with the plurality of data word lines, the NAND string having a dummy non-volatile storage element associated with the dummy word line, the dummy non-volatile storage element is a neighbor to one of the data non-volatile storage elements; and
a managing circuit in communication with the plurality of data word lines, the drain side select line, the source side select line, and the dummy word line, the managing circuit performs an erase of the NAND string, the managing circuit programs the data non-volatile storage elements sequentially in the direction from the source side select line towards the drain side select line, the managing circuit applies a programming voltage to the dummy word line after programming the data non-volatile storage elements without verifying whether a target threshold voltage level for the dummy non-volatile storage element has been reached.

14. A method for operating a non-volatile storage device, the method comprising:
erasing a plurality of NAND strings non-volatile storage elements, a NAND string includes data non-volatile storage elements, a dummy non-volatile storage element, a source side select gate, and a drain side select gate, the dummy non-volatile storage element is next to a first of the data non-volatile storage elements and is between the first data non-volatile storage element and the drain side select gate;
programming the data non-volatile storage elements sequentially in the direction from the source side select gate towards the drain side select gate; and
applying a programming voltage to the dummy non-volatile storage element after programming the data non-volatile storage elements, wherein the applying a programming voltage to the dummy non-volatile storage element is not followed by any verification whether a target threshold voltage level for the dummy non-volatile storage element has been reached.

15. The method of claim 14, wherein only a single programming pulse is applied to the dummy non-volatile storage element.

16. A non-volatile storage device comprising:
a plurality of non-volatile storage elements, a set of the plurality of non-volatile storage elements includes data non-volatile storage elements and a dummy non-volatile storage element, the dummy non-volatile storage element is a neighbor to one of the data non-volatile storage elements; and
a managing circuit in communication with the plurality of non-volatile storage elements, the managing circuit performs an erase of the plurality of non-volatile storage elements, the managing circuit soft programs the plurality of non-volatile storage elements after performing the erase, the soft programming includes the managing circuit applying a first soft program voltage to the data non-volatile storage elements while the managing circuit applies a second soft program voltage to the dummy non-volatile storage element, the second soft program voltage is less than the first soft program voltage, the managing circuit programs the data non-volatile storage elements after the soft programming.

17. The non-volatile storage device of claim 16, wherein the plurality of non-volatile storage elements are arranged as NAND strings.

18. A method comprising:
performing an erase of a plurality of non-volatile storage elements, a set of the plurality of non-volatile storage elements includes data non-volatile storage elements and a dummy non-volatile storage element, the dummy non-volatile storage element is a neighbor to one of the data non-volatile storage elements;
soft programming the plurality of non-volatile storage elements after performing the erase, the soft programming includes applying a first soft program voltage to the data non-volatile storage elements while applying a second soft program voltage to the dummy non-volatile storage element, the second soft program voltage is less than the first soft program voltage; and
programming the data non-volatile storage elements after the soft programming.

19. A non-volatile storage device comprising:
a plurality of non-volatile storage elements, a set of the plurality of non-volatile storage elements includes data non-volatile storage elements and a dummy non-volatile storage element, the dummy non-volatile storage element is a neighbor to one of the data non-volatile storage elements; and
a managing circuit in communication with the plurality of non-volatile storage elements, the managing circuit performs an erase of the plurality of non-volatile storage elements, the managing circuit programs the data non-volatile storage elements, at least some of the data non-volatile storage elements experience an apparent increase in threshold voltage due to coupling that occurs due to subsequent programming of another of the data non-volatile storage elements by the managing circuit, the managing circuit selects a programming voltage to apply to the dummy non-volatile storage elements to increase the threshold voltage of the dummy non-volatile storage element to a target threshold voltage level that compensates for lesser coupling experienced by the neighbor non-volatile storage element during programming of the other data non-volatile storage elements, the managing circuit applies the programming voltage to the dummy non-volatile storage element after programming the data non-volatile storage elements, the programming voltage increases the threshold voltage of the dummy non-volatile storage element to the target threshold voltage level that compensates for lesser coupling experienced by the neighbor non-volatile storage element during programming of the other data non-volatile storage elements, wherein after applying a programming voltage to the dummy non-volatile storage element the managing circuit does not verify whether the target threshold voltage level for the dummy non-volatile storage element has been reached.

20. A non-volatile storage device comprising:
a plurality of NAND strings, a NAND string having a plurality of data non-volatile storage elements and a dummy non-volatile storage element, the dummy non-volatile storage element is a neighbor to one of the data non-volatile storage elements; and
a managing circuit in communication with the plurality of NAND strings, the managing circuit performs an erase of the plurality of NAND strings, the managing circuit programs a first of the NAND strings, as a part of the programming the managing circuit applies one or more programming voltages to the data non-volatile storage elements, at least some of the data non-volatile storage elements experience an apparent increase in threshold voltage due to floating gate coupling that occurs due to subsequent programming of another of the non-volatile storage elements, as a part of the programming the managing circuit verifies that each of the data non-volatile storage elements has been programmed to a target threshold voltage for the respective data non-volatile storage element, the managing circuit selects at least one programming voltage to apply to the dummy non-volatile storage elements to increase the threshold voltage of the dummy non-volatile storage element to a target threshold voltage level that compensates for lesser coupling experienced by the neighbor non-volatile storage element during programming of the other data non-volatile storage elements, as a part of the programming the managing circuit applies the at least one programming voltage to the dummy non-volatile storage element after verifying that each of the data non-volatile storage elements has been programmed to the target threshold voltage for the respective non-volatile storage element, the at least one programming voltage increases the threshold voltage of the dummy non-volatile storage element to the target threshold voltage level that compensates for lesser floating gate coupling experienced by the neighbor non-volatile storage element during programming of the other data non-volatile storage elements, wherein the managing circuit does not verify that the target threshold voltage level for the dummy non-volatile storage element has been reached.

* * * * *